(12) United States Patent
Liu et al.

(10) Patent No.: US 11,037,614 B2
(45) Date of Patent: Jun. 15, 2021

(54) IMPRINT-FREE WRITE DRIVER FOR FERROELECTRIC MEMORY

(71) Applicant: Intel Corporation, Santa Clara, CA (US)

(72) Inventors: Huichu Liu, Santa Clara, CA (US); Sasikanth Manipatruni, Portland, OR (US); Ian A. Young, Portland, OR (US); Tanay Karnik, Portland, OR (US); Daniel H. Morris, San Francisco, CA (US); Kaushik Vaidyanathan, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/615,780

(22) PCT Filed: Jul. 23, 2018

(86) PCT No.: PCT/US2018/043236
§ 371 (c)(1),
(2) Date: Nov. 21, 2019

(87) PCT Pub. No.: WO2019/023101
PCT Pub. Date: Jan. 31, 2019

(65) Prior Publication Data
US 2020/0098415 A1 Mar. 26, 2020

Related U.S. Application Data

(60) Provisional application No. 62/538,546, filed on Jul. 28, 2017.

(51) Int. Cl.
*G11C 11/22* (2006.01)
*H01L 27/11507* (2017.01)
*H01L 49/02* (2006.01)

(52) U.S. Cl.
CPC ........ *G11C 11/2275* (2013.01); *G11C 11/221* (2013.01); *G11C 11/2259* (2013.01); *H01L 27/11507* (2013.01); *H01L 28/55* (2013.01)

(58) Field of Classification Search
CPC .............. G11C 11/2275; G11C 11/221; G11C 11/2259; H01L 27/11507; H01L 28/55
(Continued)

(56) References Cited

U.S. PATENT DOCUMENTS

2007/0058415 A1* 3/2007 Im .......................... H01L 28/55
 365/145
2008/0225569 A1* 9/2008 Nawano ................. H01G 4/085
 365/145

(Continued)

FOREIGN PATENT DOCUMENTS

WO 2016190880 12/2016

OTHER PUBLICATIONS

"Large-Signal Switching of Bipolar Transistors and MOSFETs" by Marc T. Thompson Ph.D., in Intuitive Analog Circuit Design (Second Edition), 2014, (Year: 2014).*

(Continued)

*Primary Examiner* — Fernanco Hidalgo
(74) *Attorney, Agent, or Firm* — Green, Howard & Mughal LLP

(57) ABSTRACT

Described is an apparatus to reduce or eliminate imprint charge, wherein the apparatus which comprises: a source line; a bit-line; a memory bit-cell coupled to the source line and the bit-line; a first multiplexer coupled to the bit-line; a second multiplexer coupled to the source-line; a first driver coupled to the first multiplexer; a second driver coupled to the second multiplexer; and a current source coupled to the first and second drivers.

20 Claims, 14 Drawing Sheets

(58) Field of Classification Search
USPC .......................................................... 365/145
See application file for complete search history.

(56) References Cited

U.S. PATENT DOCUMENTS

| | | | |
|---|---|---|---|
| 2009/0233382 A1* | 9/2009 | Moise, IV | H01L 28/55 |
| | | | 438/3 |
| 2010/0290280 A1 | 11/2010 | Seo et al. | |
| 2012/0075926 A1 | 3/2012 | Hanzawa et al. | |
| 2012/0300530 A1 | 11/2012 | Meade et al. | |
| 2014/0140127 A1 | 5/2014 | Oh | |
| 2016/0376708 A1* | 12/2016 | Ma | C04B 35/493 |
| | | | 427/226 |
| 2017/0040523 A1* | 2/2017 | Sakai | H01L 41/318 |
| 2018/0122478 A1 | 5/2018 | Morris et al. | |
| 2018/0277171 A1* | 9/2018 | Matsuoka | G11C 11/1653 |
| 2018/0338346 A1* | 11/2018 | Routt | H04L 43/0876 |
| 2019/0318774 A1* | 10/2019 | Kittl | G11C 11/221 |

OTHER PUBLICATIONS

International Preliminary Report on Patentability from PCT/US2018/043236 dated Feb. 6, 2020, 11 pgs.
International Search Report and Written Opinion from PCT/US2018/043236 dated Nov. 6, 2018, 12 pgs.

\* cited by examiner

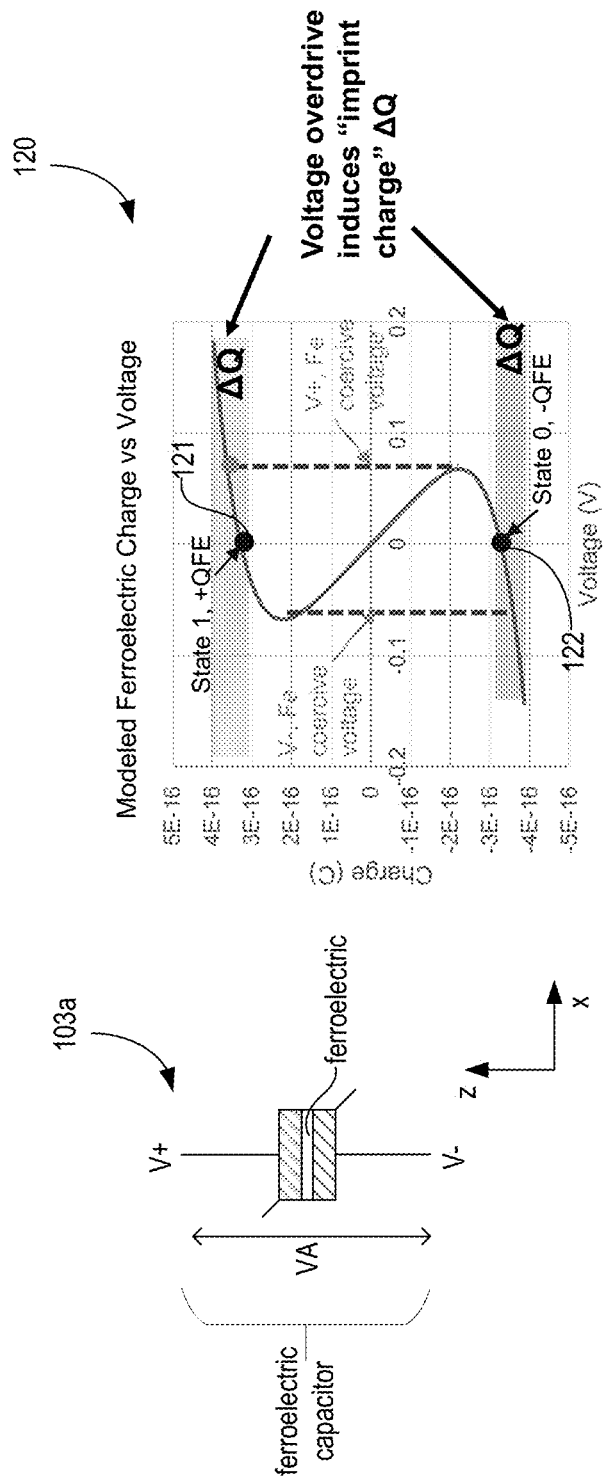

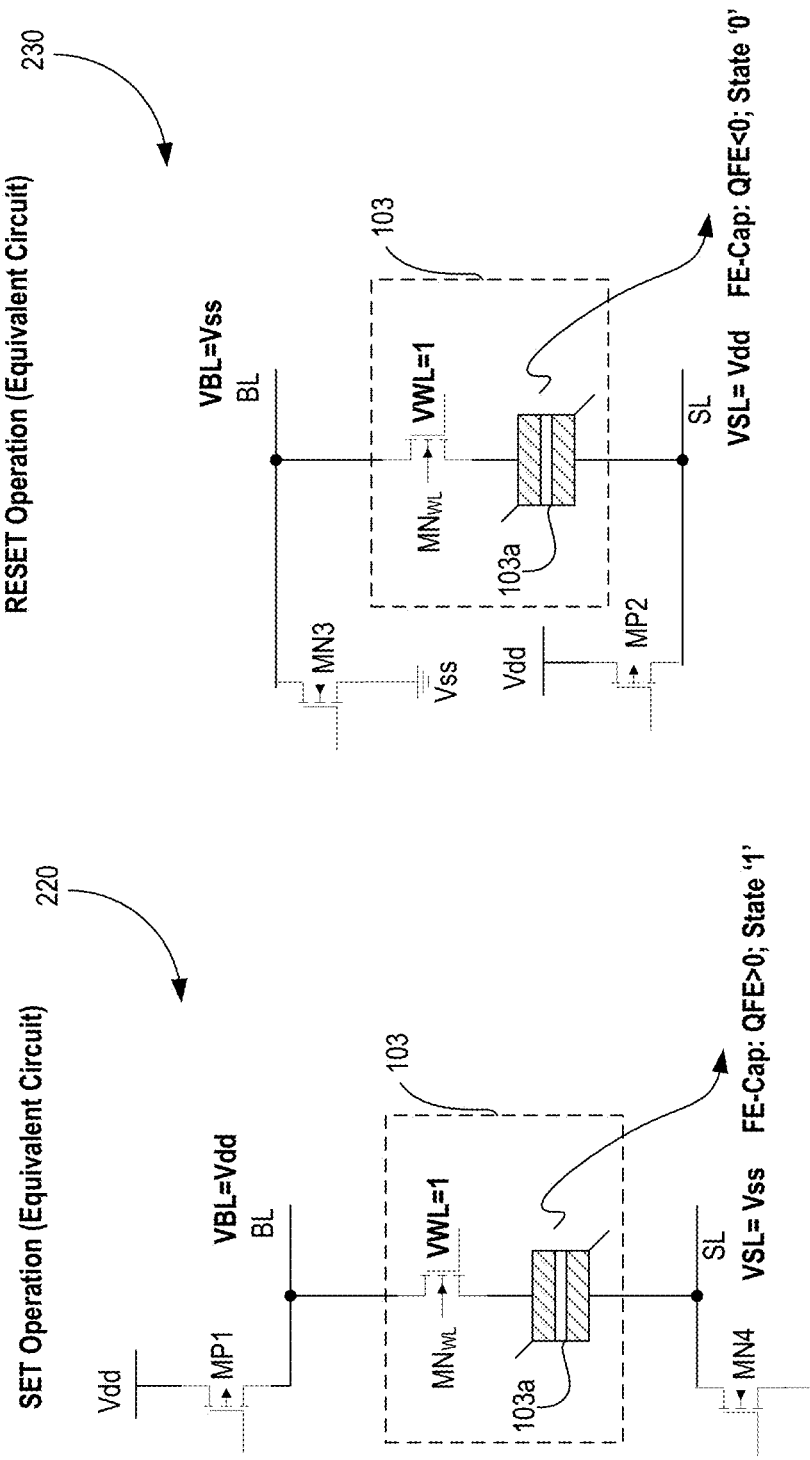

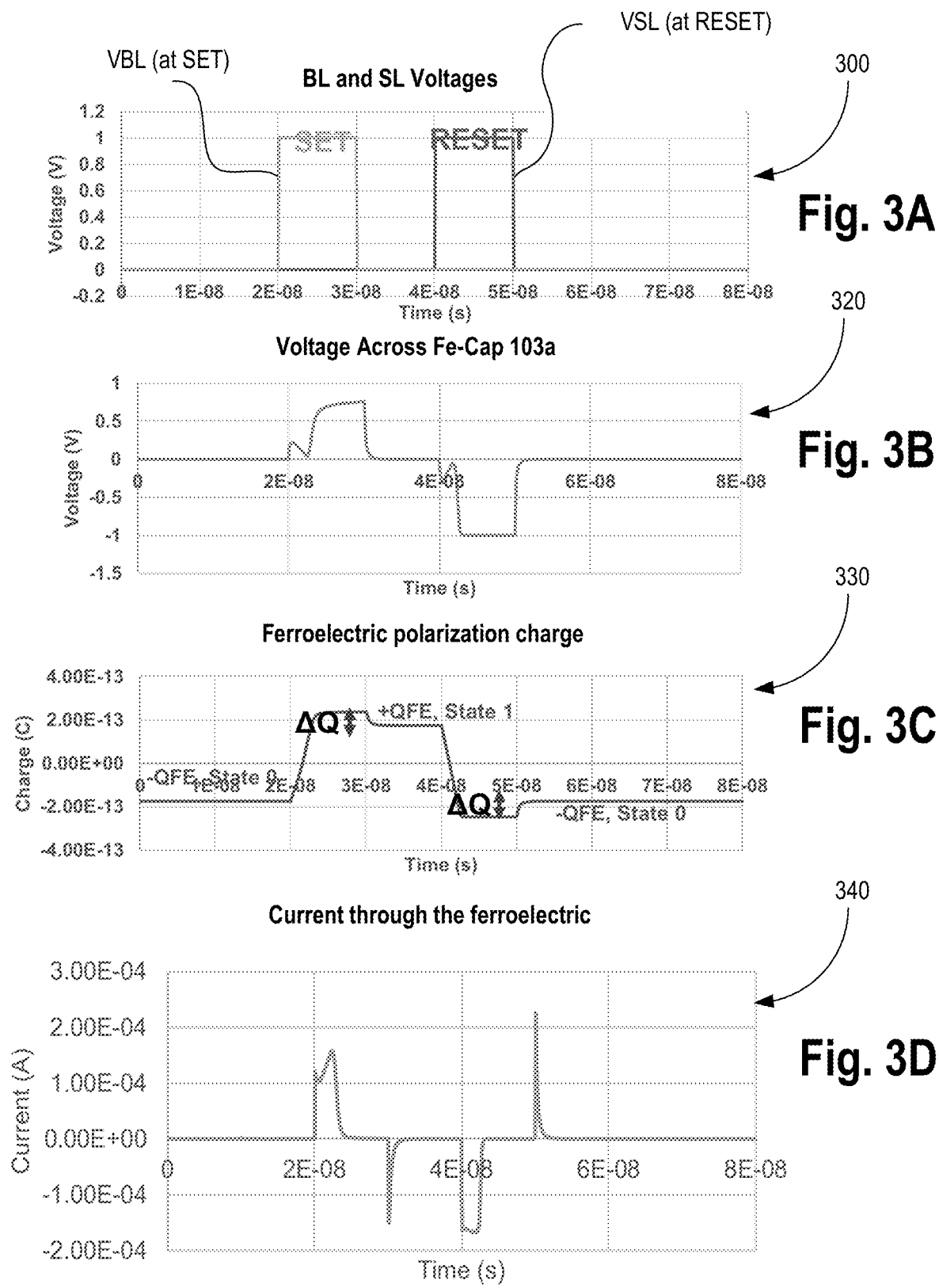

IMPRINT-FREE WRITE DRIVER FOR FERROELECTRIC MEMORY

CLAIM OF PRIORITY

This Application is a National Stage Entry of, and claims priority to, PCT Application No. PCT/US2018/043236, filed on Jul. 23, 2018 and titled "IMPRINT-FREE WRITE DRIVER FOR FERROELECTRIC MEMORY," which claims the benefit of priority of U.S. Provisional Application No. 62/538,546, filed on Jul. 28, 2017 and titled "IMPRINT-FREE WRITE DRIVER FOR FERROELECTRIC MEMORY," which is incorporated by reference in its entirety for all purposes.

BACKGROUND

Ferroelectric material has been investigated for non-volatile logic applications such as embedded ultra-low power applications, energy scavenging systems, internet of things (IOT), etc.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a schematic of a ferroelectric capacitor (FE-Cap).

FIG. 1B illustrates a plot showing charge versus voltage function of the FE-Cap, its memory states, and imprint charge.

FIG. 2B illustrates an equivalent circuit of FIG. 2A during a SET operation.

FIG. 2C illustrates an equivalent circuit of FIG. 2A during a RESET operation.

FIGS. 3A-D illustrate plots showing waveforms of voltage-based write driver of FIG. 2A including SET and RESET operations and imprint charges.

DETAILED DESCRIPTION

Figure 2A:
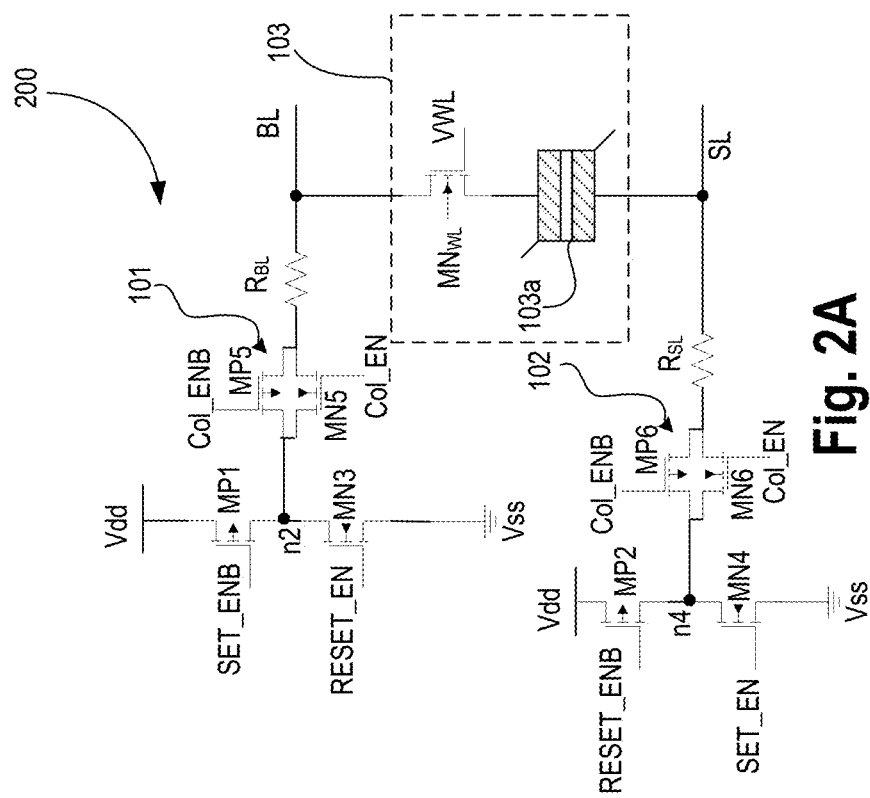
FIG. 2A illustrates a conventional voltage-based write driver for ferroelectric memory.

Some embodiments describe an imprint-free write driver for ferroelectric capacitor based non-volatile memory. In some embodiments, the write driver comprises a current source and a shunt resistor which eliminates the additional charge deposition and imprint voltages on the ferroelectric capacitor. The ferroelectric capacitor based non-volatile memory comprises bit-cells having one-transistor and one-capacitor (1T1C). Some embodiments describe a memory architecture that comprises a memory array having a 1T1C based memory bit-cells, where each bit-cell includes a backend transistor and ferroelectric capacitor. In various embodiments, peripheral circuits, such as the imprint-free write driver, associated with the memory bit-cells are fabricated on the frontend of a die. In some embodiments, the access transistor of the 1T1C memory bit-cell is a vertical backend transistor.

The use of ferroelectric capacitor for the 1T1C memory bit-cell allows for longer retention time than regular capacitors. For example, by using a thin ferroelectric capacitor instead of conventional DRAM capacitor: retention time is increased thus refresh power is decreased significantly; either read signal can be increased or ferroelectric capacitor area/height can be scaled due to larger charge density of polarization of FE relative to conventional dielectrics capacitors; and strict leakage requirement for access transistor MN is removed. As such, in some cases, any transistor with relaxed leakage and threshold (Vt) levels can be used (e.g., up to 10 nA/um instead of strict approximately 1 pA/μm leakage levels).

There are many technical effects of various embodiments. For example, the current-based write driver can (1) avoid "imprint voltage" and eliminate (or substantially eliminate) the additional charge induced on the ferroelectric capacitor during switching; and (2) reduce the overall energy consumption of the non-volatile memory. In some embodiments, by using backend transistors, conventional frontend transistors can be utilized for sub-array circuits (e.g., the imprint-free driver) improving total effective memory density; and ferroelectric capacitor can be fabricated at higher metal layers that are far away from critical dimension metal layers at lower levels. This also enables taller a ferroelectric capacitor since metal heights are larger at the backend. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The term "scaling" may also refer to adjusting the magnitude of the power supply voltage (e.g., voltage scaling) to the circuit(s).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

It is to be understood that the terms so used are interchangeable under appropriate circumstances such that the embodiments of the invention described herein are, for example, capable of operation in other orientations than those illustrated or otherwise described herein.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

For purposes of the embodiments, the transistors in various circuits, modules, and logic blocks may be Tunneling FETs (TFETs) or some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used for some transistors without departing from the scope of the disclosure.

Here, the term "backend" generally refers to a section of a die which is opposite of a "frontend" and where an IC (integrated circuit) package couples to IC die bumps. For example, high level metal layers (e.g., metal layer 6 and above in a ten metal stack die) and corresponding vias that are closer to a die package are considered part of the backend of the die. In another instance, a region of a die over and including the first metal layer is referred to as the backend region. Conversely, the term "frontend" generally refers to a section of the die that includes the active region (e.g., where transistors are fabricated) and low level metal layers and corresponding vias that are closer to the active region (e.g., metal layer 5 and below in the ten metal stack die example). In another example, a region of a die below the first metal layer is referred to as the frontend region.

It is pointed out that those elements of the figures having the same reference numbers (or names) as the elements of any other figure can operate or function in any manner similar to that described, but are not limited to such.

FIG. 1A illustrates a schematic 103a of a ferroelectric capacitor (FE-Cap). The FE-Cap includes ferroelectric material. In some embodiments, the thickness of the ferroelectric material (along the z-axis) is in the range of 50 Angstroms (A) to 110 A. In some embodiments, the ferroelectric material comprises includes one of: Ti, Hf, Zr, Al, Nb, La, Sr, or O. In some embodiments, ferroelectric material includes one of: TiAl, Nb doped $SrTiO_3$ (STO), La doped STO, $SrTiO_3$, $BiFeO_3$ (BFO) $BiTeO_3$, $BaTiO_3$, $HfZrO_2$ (HZO). In some embodiments, ferroelectric material includes a super lattice of $PbTiO_3$ (PTO) and $SrTiO_3$ (STO). In some embodiments, the super lattice of PTO and STO is repeated in a range of 2 to 100 times. For examples, alternating layers of PTO and STO are repeated 2 to 100 times.

In some embodiments, the ferroelectric material includes: a first layer comprising metal; a second layer comprising metal; and two or more layers coupled between the first and second layers, wherein the two or more layers include a first layer comprising a conductive oxide, a second layer comprising a conductive oxide, and a third layer comprising a perovskite, wherein the third layer is adjacent to the first and second layers. In some embodiments, the two or more layers comprises a fourth layer adjacent to one of the first or second layers of the two or more layers, wherein the fourth layer comprises a conductive seed layer. In some embodiments, the fourth layer includes one of: Ti, Al, Nb, La, or $SrTiO_3$ (STO). In some embodiments, the fourth layer includes one of: TiAl, Nb doped STO, or La doped STO. In some embodiments, the first and second layers of the two or more layers include one of: Sr, Ru, La, Sr, Mn, Nb, Cr, or O. In some embodiments, the first and second layers of the two or more layers include one of: $SrRuO_3$, $(La,Sr)CoO_3$ [LSCO], $La_{0.5}Sr_{0.5}Mn_{1-x}Ni_xO$, Cu-doped $SrFe_{0.9}Nb_{0.1}O_3$, or $(La,Sr)CrO_3$. In some embodiments, the third layer includes one of: Sr, Ti, O, Bi, Fe, or Ba. In some embodiments, the third layer includes one of: $SrTiO_3$, $BiFeO_3$, $BiTeO_3$, or $BaTiO_3$. In some embodiments, the third layer includes a super lattice of $PbTiO_3$ (PTO) and $SrTiO_3$ (STO). In some embodiments, the super lattice of PTO and STO are repeated in a range of 2 to 100 times. For examples, alternating layers of PTO and STO are repeated 2 to 100 times. In some embodiments, the metal for the first and second layers of the ferroelectric material comprises one of: TiN, TaN, N, Ta, W, Au, Al, Cu, Ag, Co, or Graphene.

FIG. 1B illustrates a plot 120 showing charge versus voltage function of the FE-Cap, its memory states, and imprint charge. Unlike a normal dielectric based capacitor, a ferroelectric capacitor uses polarization charge to store the memory states, where positive and negative polarization charge indicates state "1" or "0". To switch an FE-cap, the applied FE-cap voltage VA must be higher than the ferroelectric coercive voltages (which behave as threshold voltages) when driven by a voltage source. For example, VA is greater than V+ for 0 to 1 switching, and VA is less then V− for 1 to 0 switching. The write driver for ferroelectric is typically based on voltage sources and these voltage sources induce an "imprint" voltage on the ferroelectric capacitor due to additional charge deposition, even with VA=V+ for SET, VA=V− for RESET.

FIG. 2A illustrates an apparatus 200 with a conventional voltage-based write driver for a ferroelectric memory. The memory bit-cell 103 is a one transistor and one capacitor (1T1C) based memory cell, where the capacitor is implemented as a ferroelectric capacitor 103a. Here, the transistor of the memory cell 103 is an n-type transistor $MN_{WL}$ (also referred to as an access transistor) controlled by word-line (WL) and a FE-Cap 103a coupled in series with the transistor $MN_{WL}$. One of source/drain terminal of transistor $MN_{WL}$ is coupled to a bit-line (BL) while one terminal of the FE-Cap 103a is coupled to a source line (SL) or select line, also referred to as plate-line.

Voltages on BL and SL are controlled by a write driver which is part of the peripheral circuit. In this example, the write driver comprises a BL driver which includes p-type transistor MP1 and n-type transistor MN3, and a SL driver which includes p-type transistor MP2 and n-type transistor MN4, first column multiplexer 101 comprising p-type transistor MP5 and n-type transistor MN5, second column multiplexer 102 comprising p-type transistor MP6 and n-type transistor MN6, BL resistance $R_{BL}$, and SL resistance $R_{SL}$ coupled together as shown. The BL and SL drivers are controlled by SET_EN (set enable signal) and RESET_EN (reset enable signal) and their complementary signals SET_ENB and RESET_ENB, respectively. The first and second column multiplexers are controlled by Col_EN and its complimentary Col_ENB. Logic generating the SET_EN, SET_ENB, RESET_EN, and RESET_ENB are not shown. However, the functional use of these signals is described that can be used to implement the logic generating those control signals.

During SET operation, WL is high, RESET_EN is low and SET_EN is high, and first and second column multiplexers are on (e.g., Col_EN is high). As such, transistor MP1 is on and BL is charged to Vdd (power supply level) and transistor MN4 is on causing SL to be discharged to ground. A voltage is applied to the FE-Cap 103a to flip the state of the FE-Cap 103a. The state of the FE-Cap 103a during SET operation is '1' because the charge on the FE-Cap 103a is greater than zero.

During RESET operation, WL is high, RESET_EN is high and SET_EN is low, and first and second column multiplexers are on (e.g., Col_EN is high). As such, transistor MN3 is on and BL is discharged to ground and transistor MP2 is on causing SL to be charged to power supply (Vdd). The state of the FE-Cap 103a during RESET operation is '0' because the charge on the FE-Cap 103a is less than zero.

FIG. 2B illustrates an equivalent circuit 220 of FIG. 2A during a SET operation. FIG. 2C illustrates an equivalent circuit 230 of FIG. 2A during a RESET operation. In the conventional voltage-based write driver, an extra charge is applied to the FE-Cap 103a to flip the state of the FE-Cap 103a. During SET operation, the charge QFE on the FE-Cap 103a is greater than zero to store State '1', while in RESET operation, the charge QFE on the FE-Cap 103a is less than zero to store State '0'. In some cases, the imprint charge on the FE-Cap 103a does not leak away and may cause reliability issues to the memory cell. For example, the imprint charge may cause disturbance to the ferroelectric state. As such, excess energy may be needed by the voltage-based drivers to flip the ferroelectric state because of the imprint charge.

FIGS. 3A-D illustrate plots 300, 320, 330, and 340, respectively, showing waveforms of voltage-based write driver of FIG. 2A including SET and RESET operations and imprint charges.

Figure 4:
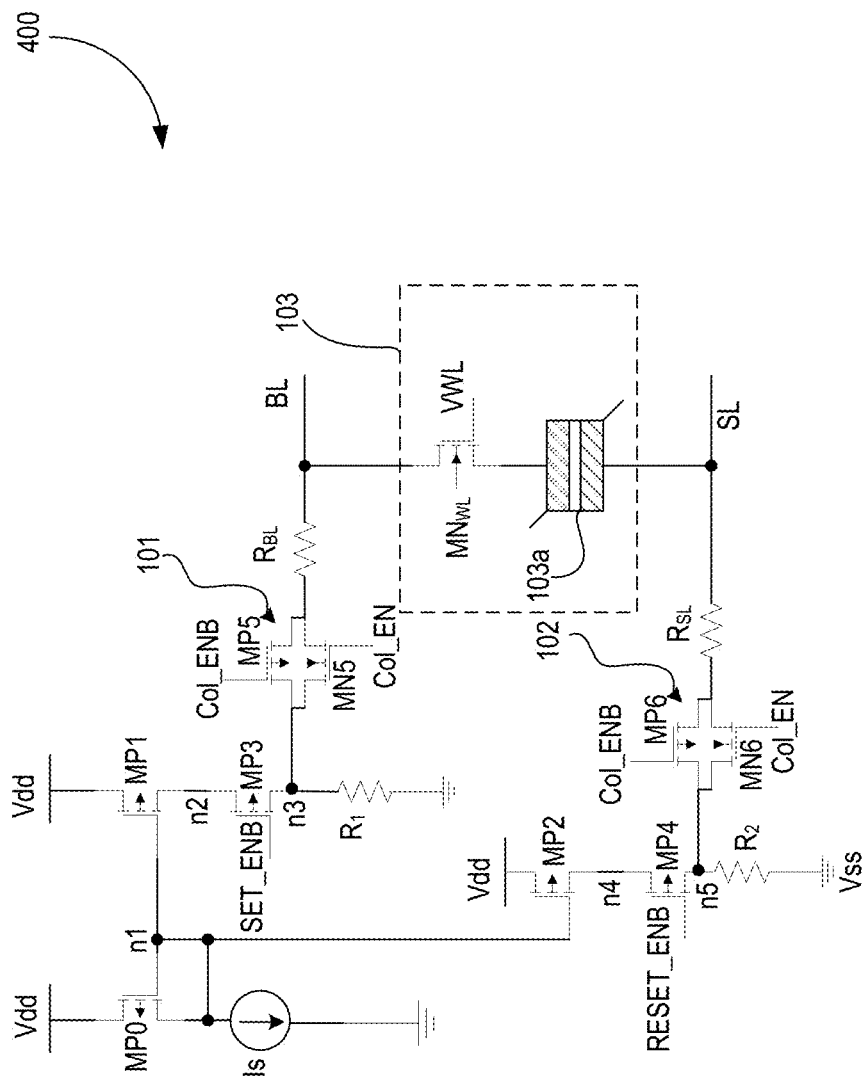
FIG. 4 illustrates a schematic of an imprint-free write driver, according to some embodiments.

FIG. 4 illustrates an apparatus 400 with an imprint-free write driver, according to some embodiments. In some embodiments, the imprint-free write driver comprises a p-type (e.g., PMOS) based current mirror comprising transistors MP0 and MP1. In some embodiments, transistor MP1 is in series with a SET-enabled controlled p-type (e.g., PMOS) transistor MP3. In some embodiments, another p-type (e.g., PMOS) based current mirror comprising transistors MP0 and MP2 is provided. In some embodiments, transistor MP2 is in series with a RESET enabled p-type transistor (e.g., PMOS) MP4. In some embodiments, a constant current source Is in series with the drain of transistor MP0. In some embodiments, transistor MP0 is diode-connected and shared by MP1 and MP2 current mirrors. As such, voltage on node n1 biases both transistors MP1 and MP2. Transistor MP1 is coupled to transistor MP3 at node n2. Transistor MP2 is coupled to transistor MP4 at node n4.

In some embodiments, shunt resistors R1 and R2 are provided which are coupled in series with the drain of transistors MP3 and MP4 at nodes n3 and n4, respectively. In some embodiments, column pass transistors 101 and 102 are controlled by column enable signal Col_EN to control the access to a bit-line (BL) and select line (SL). In some embodiments, a bit-cell 103 is provided which comprises an n-type access transistor $MN_{WL}$ controllable by word-line, wherein the n-type transistor $MN_{WL}$ is in series with the ferroelectric capacitor 103a. In some embodiments, the bit-cell comprises a p-type access transistor (not shown) controllable by word-line, wherein the p-type transistor is in series with a ferroelectric capacitor. For simplicity, the bit-cell is referred to as 1T1C (one transistor one capacitor). The two terminals of the bit-cell is connected to BL and SL, respectively. Here, $R_{BL}$ and $R_{SL}$ are the parasitic resistances of BL and SL, respectively.

In some embodiments, transistor $MN_{WL}$ of memory cell 103 is a vertical backend transistor which allows for significantly better memory properties than conventional 1T1C transistors such as embedded dynamic random access memory (eDRAM). The use of FE-Cap 103a allows for longer retention time than regular capacitors. For example, by using a thin ferroelectric capacitor instead of conventional DRAM capacitor: retention time is increased thus refresh power is decreased significantly; either read signal can be increased or capacitor (COB) area/height can be scaled due to larger charge density of polarization of FE relative to conventional dielectrics capacitors; and strict leakage requirement for access transistor MN is removed. As such, in some cases, any transistor with relaxed leakage and threshold (Vt) levels can be used (e.g., up to 10 nA/um instead of strict approximately 1 pA/µm leakage levels).

In some embodiments, access transistor $MN_{WL}$ is a backend transistor as opposed to a frontend transistor. By using backend transistors, conventional frontend transistors can be utilized for sub-array circuits improving total effective memory density; and ferroelectric capacitor (FE-Cap) can be fabricated at higher metal layers that are far away from critical dimension metal layers at lower levels. This also enables taller FE-Cap since metal heights are larger at the backend. As FE-Cap height increases, more charge can be stored.

In some embodiments, access transistor $MN_{WL}$ is a vertical backend transistor. By using the vertical backend transistor, source (S) and drain (D) of access transistor can be connected to upper and lower metal layer instead of consuming more area for lateral fit of S/D contact for conventional lateral transistors. This enables smaller memory cell area. In some embodiments, vertical backend transistor enables routing of BL and SL at different sides of the access transistor $MN_{WL}$. As such, layout congestion is reduced which enables more memory density. In some embodiments, the vertical structure of the vertical backend transistor enables optimization of structure to minimize WL to BL parasitic capacitance thus improving read signal to noise ratio.

In some embodiments, the bit-line and/or source-line comprises metal (e.g., one or more of: Ta, W, Ag, Au, Al, Co, Cu, or Graphene). In some embodiments, the Bit-line and/or source-line is formed on the backend of die.

Figures 5A, 5B:
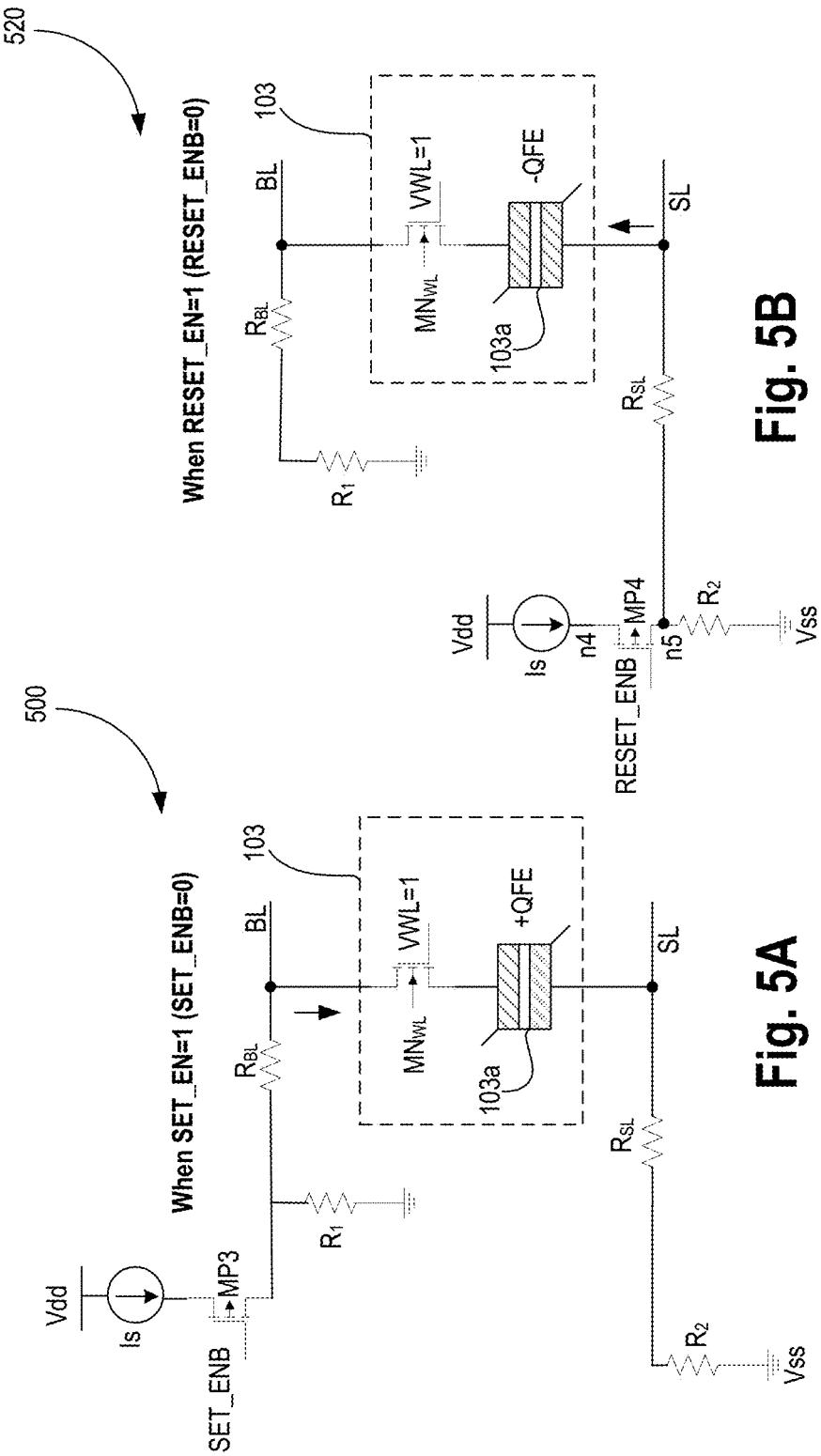
FIG. 5A illustrates an equivalent circuit of FIG. 4 during a SET operation.
FIG. 5B illustrates an equivalent circuit of FIG. 4 during a RESET operation.
Figures 6A, 6B, 6C, 6D:
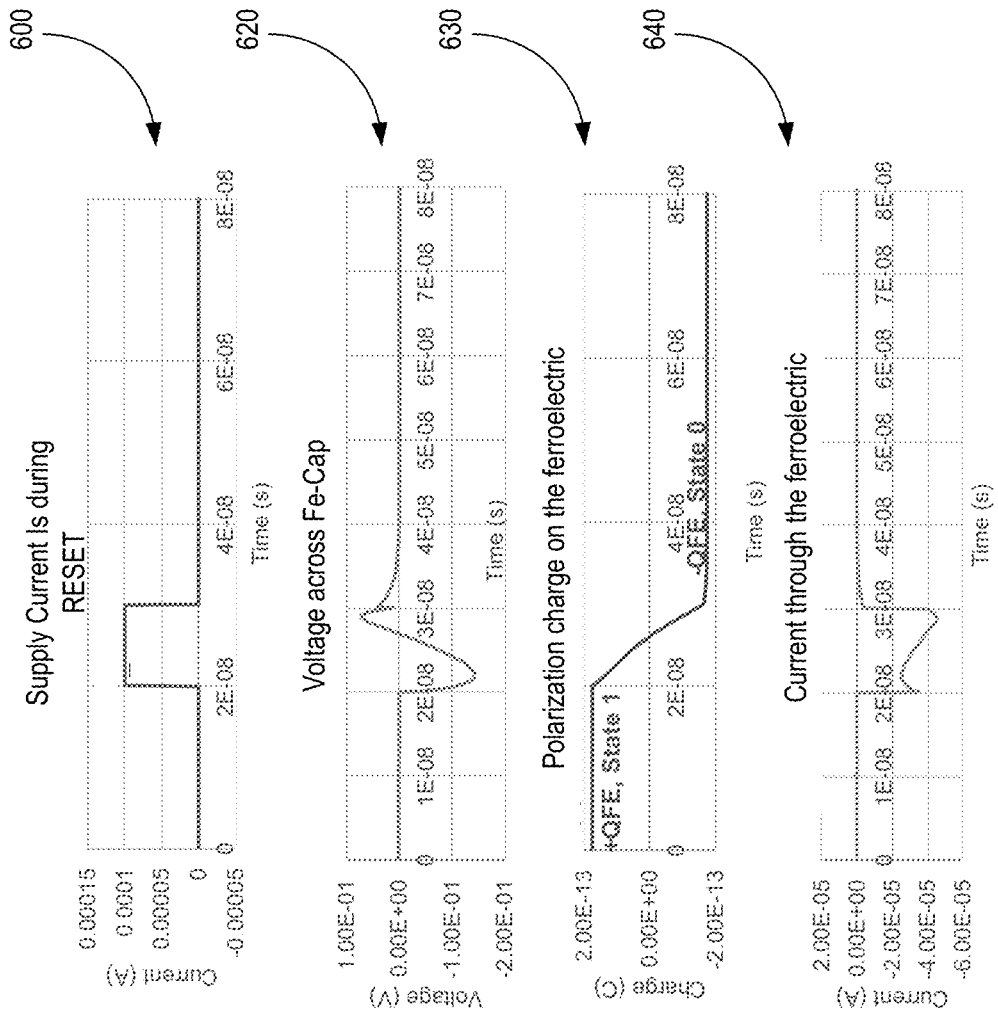
FIGS. 6A-D illustrate plots showing waveforms of current-based write driver of FIG. 4 during SET operation, according to some embodiments.
Figures 7A, 7B, 7C, 7D:
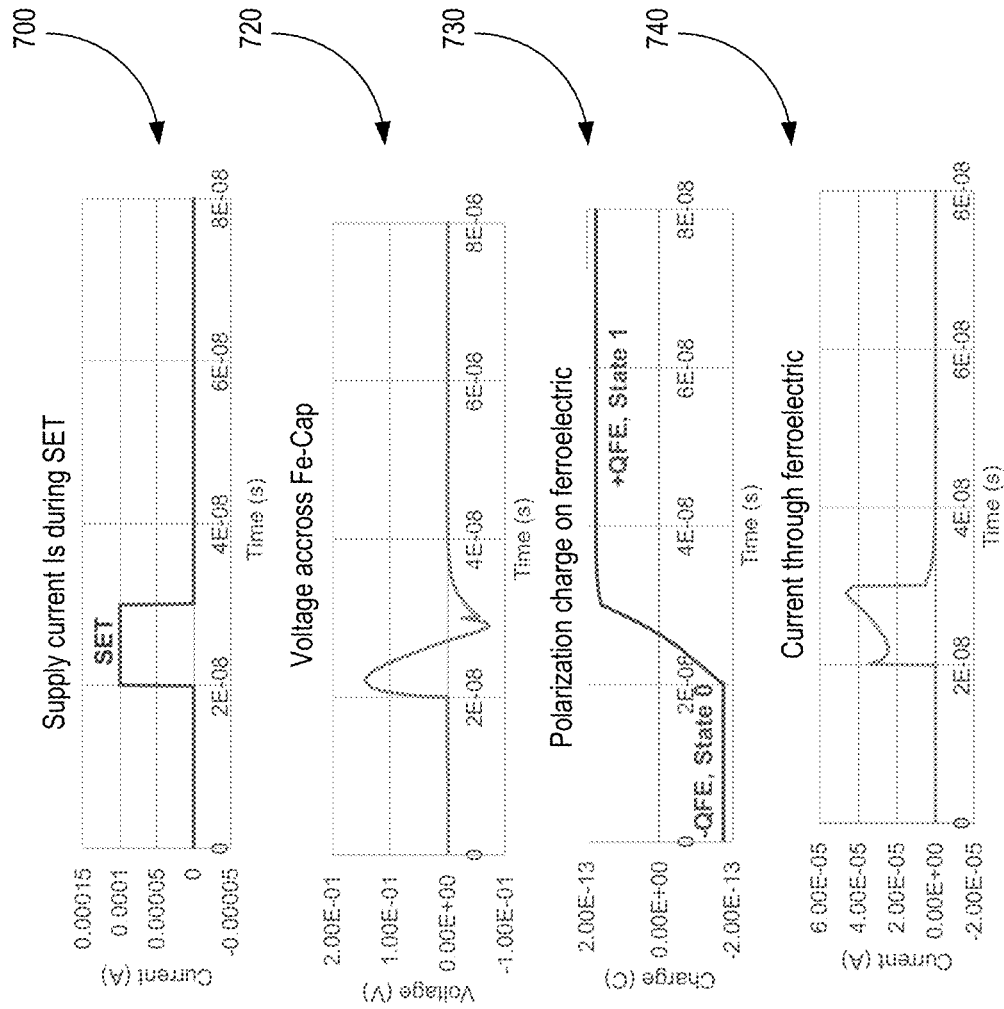
FIGS. 7A-D illustrate plots showing waveforms of current-based write driver of FIG. 4 during RESET operation, according to some embodiments.

FIG. 5A illustrates an equivalent circuit of FIG. 4 during a SET operation, in accordance with some embodiments. FIG. 5B illustrates an equivalent circuit of FIG. 4 during a RESET operation, in accordance with some embodiments. During write operation, Col_EN=1, the two pass transistors 102 and 103 are ignored for simplification. Here, wordline voltage VWL=1 for both SET and RESET operations. The SET_EN and RESET_EN controls the current duration, which also controls the charge deposited on the FE-Cap 103a. As such, SET_EN and RESET_EN form the current pulses which are applied on the FE-Cap 103a.

With reference to FIG. 5A, initial $-Q_{FE}$ polarization charge is introduced on the ferroelectric, and the FE-Cap state is "0". When SET_EN=1, RESET_EN=0, transistor MP3 is on, hence the current mirror induces current $I_S$ through resistor R1. Voltage across transistor R1, V(R1), increases and reaches V+ (e.g., the positive coercive voltage of ferroelectric), and triggers ferroelectric switching, which draws the current to 1T1C cell and reaches $+Q_{FE}$ (state "1"). Once the ferroelectric switches, the transient current through 1T1C turns off. The voltage across the FE-cap 103a is determined by its polarization charge.

With reference to FIG. 5B, initial $+Q_{FE}$ polarization charge is introduced on ferroelectric, and the FE-cap state is "1". Similarly, when RESET_EN=1, SET_EN=0, transistor MP4 is on, hence the current mirror induces current $I_S$ through resistor R2. Voltage on resistor R2, V(R2), increases and reaches |V−| (e.g., the negative coercive voltage of ferroelectric), and the ferroelectric switches, which draws the current to 1T1C cell and reaches $-Q_{FE}$ (state "0"). Once the ferroelectric switches, the transient current through 1T1C turns off. The voltage across the FE-cap 103a is determined by its polarization charge.

The charge deposited on the FE-Cap 103a is controlled by current $I_S$ supplied by the current mirror and current duration ($T_{PW}$) determined by SET_EN and RESET_EN. The voltage across the ferroelectric is then determined by the polarization charge rather than supply voltages (e.g. voltage-based write driver). Therefore, the voltage across the FE-cap 103a may not need to be higher than the corrective voltage to enable the FE-cap switching during $T_{PW}$. Hence, the "imprint" on the FE-cap can be avoided.

FIGS. 6A-D illustrate plots 600, 620, 630, and 640, respectively, showing waveforms of current-based write driver of FIG. 4 during the SET operation, according to some embodiments. FIGS. 7A-D illustrate plots 700, 720, 730, and 740 showing waveforms of current-based write driver of FIG. 4 during the RESET operation, according to some embodiments.

For these waveforms, Vdd=1V, and R1=R2=4k is used. Ferroelectric characteristics are modeled using LK equations. In this example, $I_S$=100 μA is applied for a duration of 10 ns. The charge on the ferroelectric is used to indicate the ferroelectric switching (+$Q_{FE}$=state "1", −$Q_{FE}$=state "0"). Notably, no additional charge is deposited on the FE-cap during SET and RESET. Once the FE-cap switching is completed, the voltage across the ferroelectric is zero (e.g., imprint free). Compared to FIGS. 2A-C, the transduction write driver of various embodiments can (1) effectively eliminate the imprint voltage/charge on ferroelectric, (2) reduce the energy since additional charge deposition is eliminated.

Figures 8A, 8B:
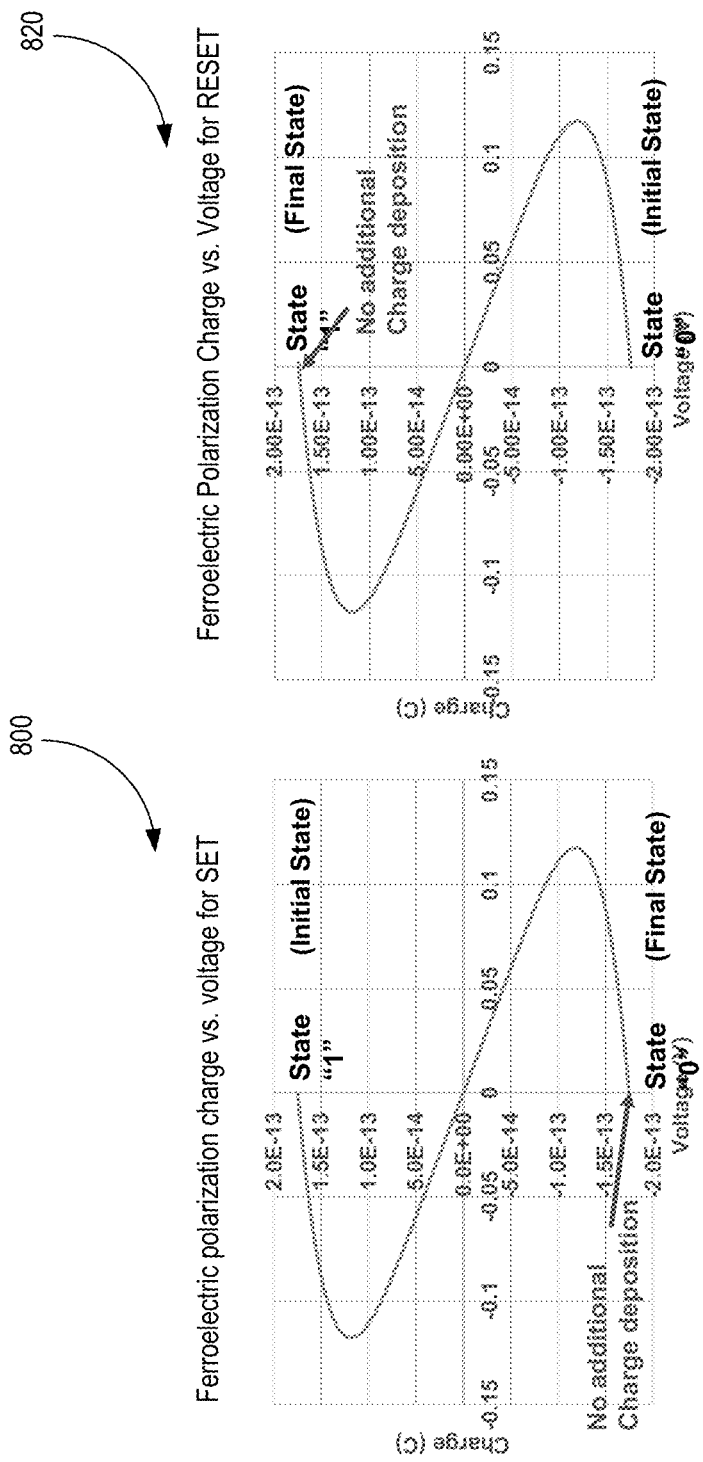
FIGS. 8A-B illustrate plots showing voltage vs. charge operations of circuits FIGS. 5A-B using SET and RESET, respectively.

FIGS. 8A-B illustrate plots 800 and 820, respectively, showing voltage vs. charge operations of circuits FIGS. 5A-B using SET and RESET, respectively. These plots show no "tail" compared to plot of FIG. 1B because the imprint charge is removed. The current-based write driver for ferroelectric memory of various embodiments resolves the imprint voltage issue. The current-based write driver also lowers the energy due to less charge deposition, which is useful for applications such as embedded non-volatility, ultra-low power energy harvesting system, Internet-of-Things (IOT), etc.

Figure 9:
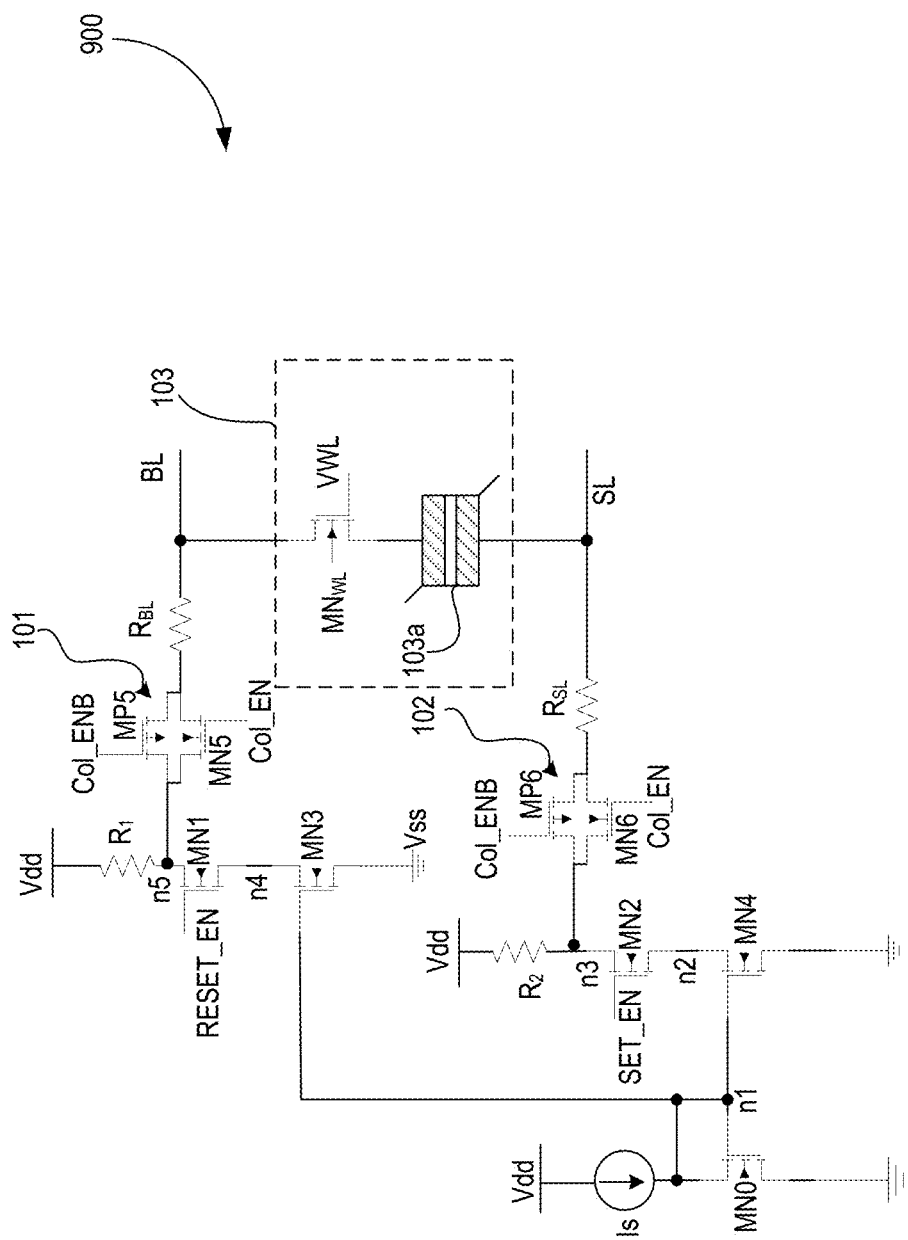
FIG. 9 illustrates a schematic of an imprint-free write driver with a shared current mirror, according to some embodiments.

FIG. 9 illustrates an apparatus 900 of an imprint-free write driver with a shared n-type transistor based current mirror, according to some embodiments. Compared to FIG. 4, here the write drivers comprise n-type transistors MN0, MN1, MN2, MN3, and MN4 coupled together as shown. Here, transistor MN1 is coupled in series with resistor R1 at node n5, while transistor MN2 is coupled in series with resistor R2 at node n3. The resistors R1 and R2 are coupled to supply Vdd. The current source Is is coupled to current mirror transistors MN0 and MN4, which are n-type devices that are biased by voltage on node n1. Transistor MN4 is coupled to transistor MN2 via node n2. Transistor MN1 is coupled to transistor MN3 via node n4. Functionally, the technical effects of the write driver of FIG. 9 is same as that of FIG. 4.

Figure 10:
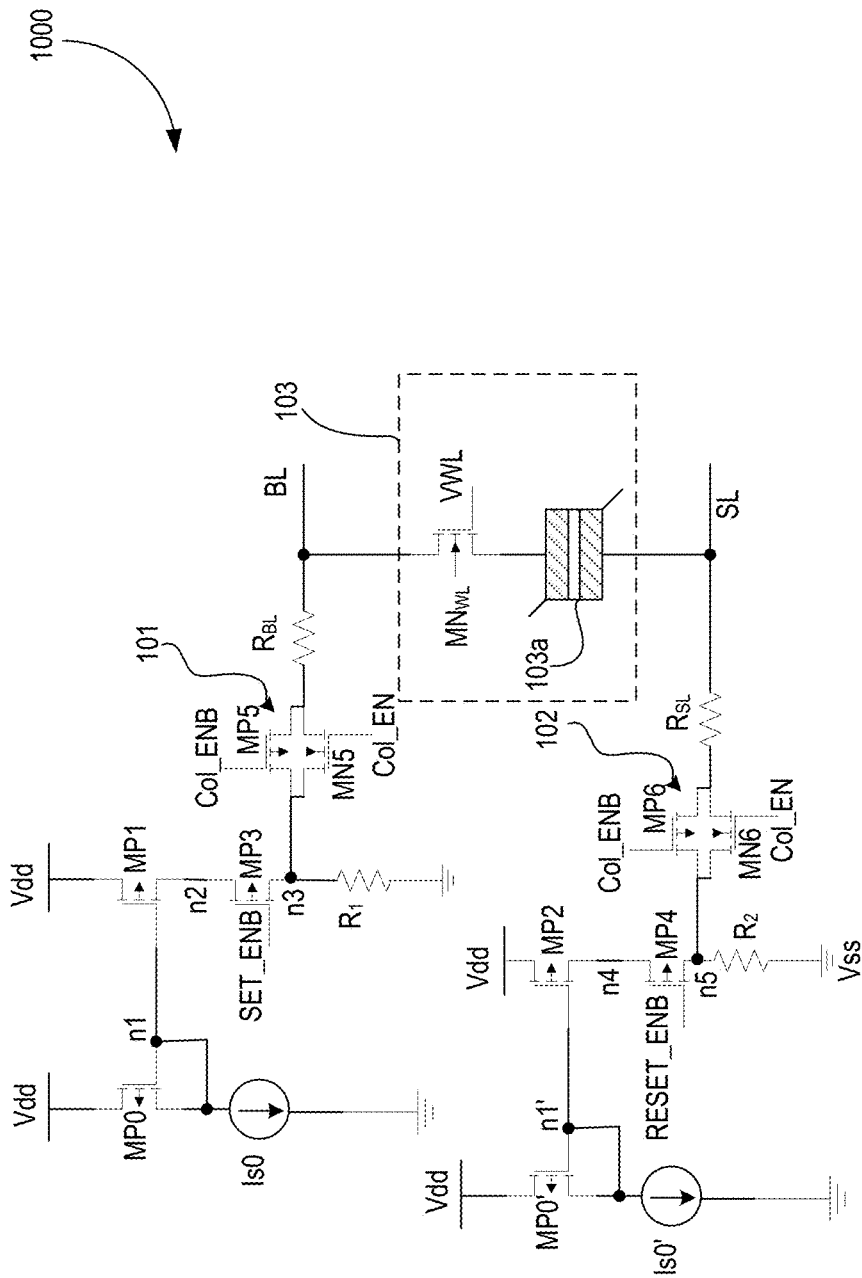
FIG. 10 illustrates a schematic of an imprint-free write driver with separate current mirrors, according to some embodiments.

FIG. 10 illustrates an apparatus 1000 of an imprint-free write driver with separate current mirrors, according to some embodiments. Compared to FIG. 4, two separate current mirrors are used for each write driver instead of sharing a common current mirror. Here, the first current source comprises transistor MP0 and source Is0, while the second current source comprises transistor MP0' and source Is0'. The voltage on node n1 biases transistor MP1, while voltage on node n1' biases transistor MP2. Functionally, the technical effects of the write driver of FIG. 10 is same as that of FIG. 4.

Figure 11:
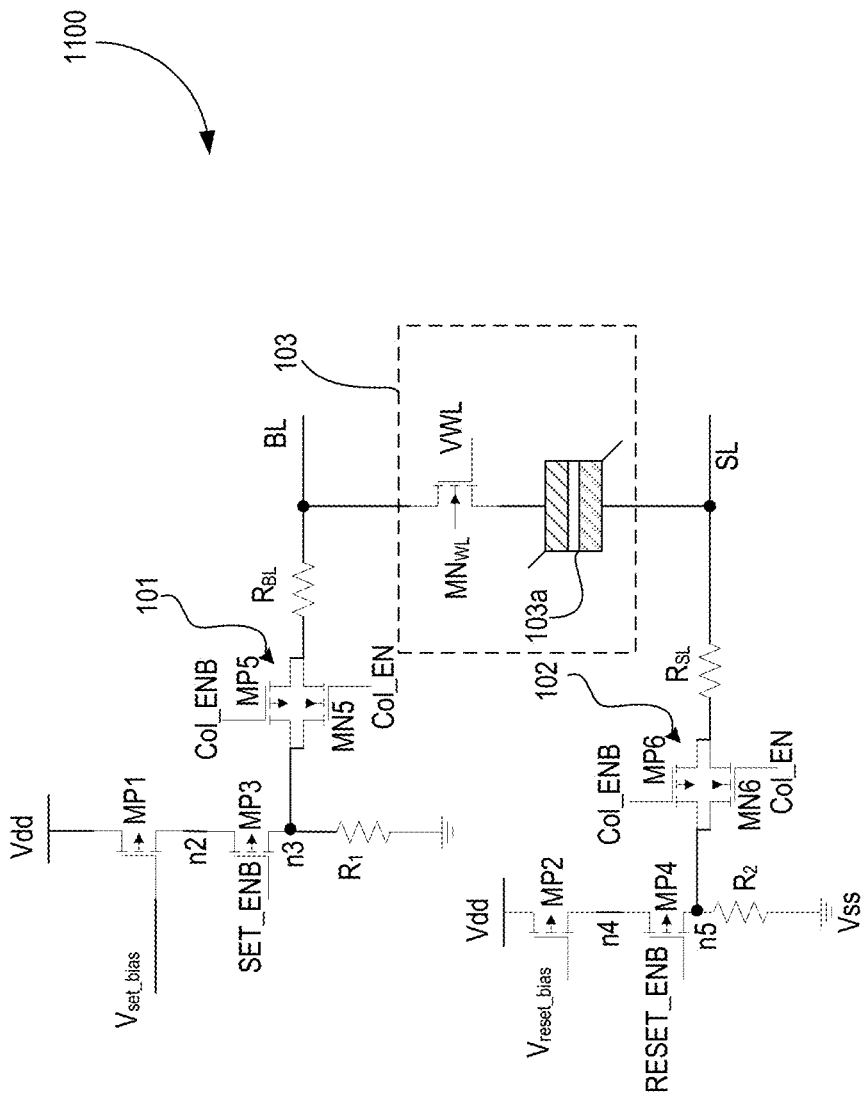
FIG. 11 illustrates a schematic of an imprint-free write driver with adjustable biases, according to some embodiments.

FIG. 11 illustrates an apparatus 1100 of an imprint-free write driver with adjustable biases, according to some embodiments. Compared to FIG. 4, here the bias voltages Vset_bias and Vreset_bias of the write drivers are adjustable to remove the imprint charge on the ferroelectric material. For example, nodes n1 (or n1') that were used provide fixed bias to transistors MP1 and MP2, are now replaced with adjustable biases Vset_bias and Vreset_bias. Any suitable bias circuitry can be used to generate biases Vset_bias and Vreset_bias. In some embodiments, the strength of the write driver transistors (e.g., transistors MP1, MP3, MP2, and MP4) is controllable by fuse (e.g., hardware) or software.

Figure 12:
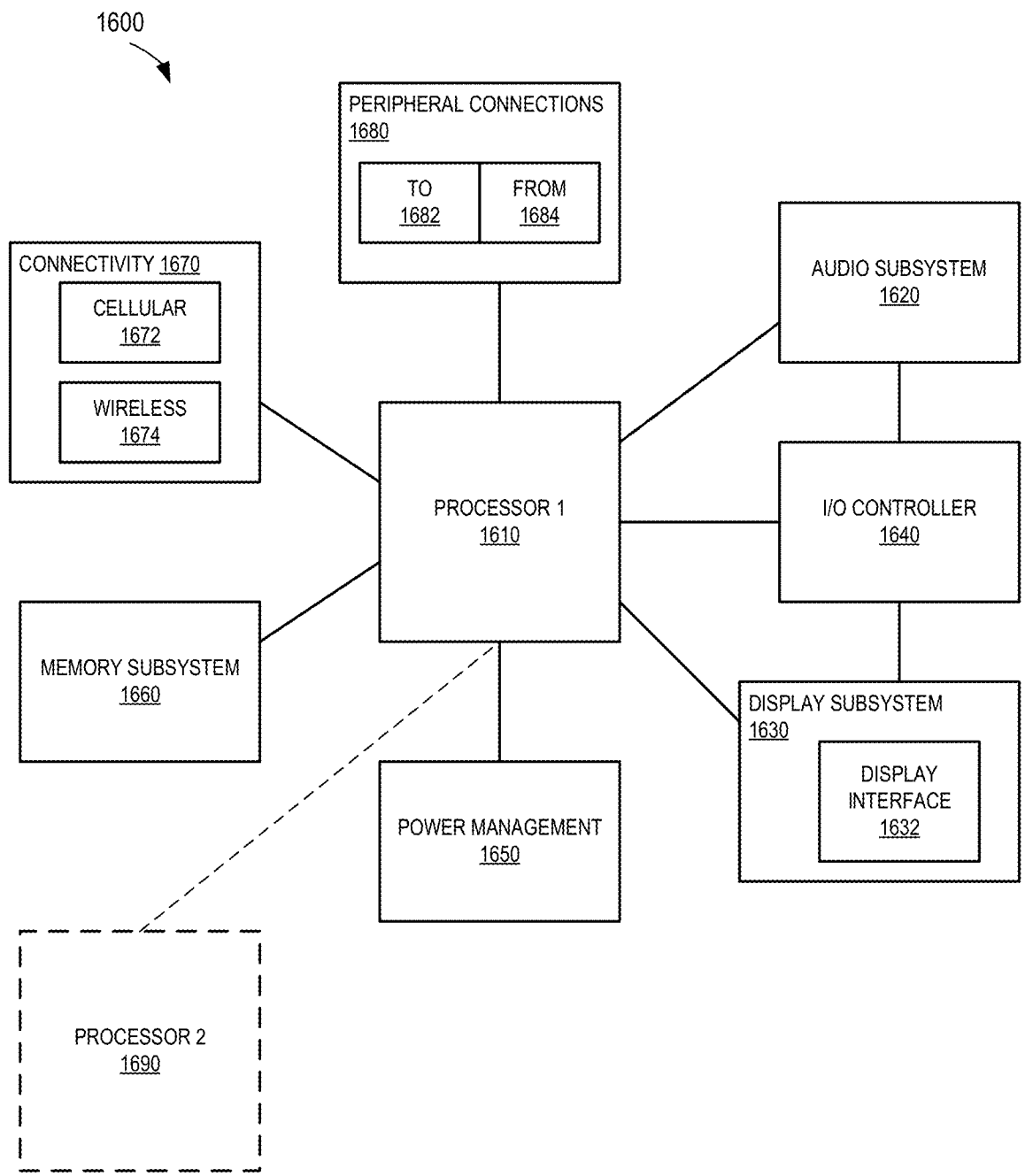
FIG. 12 illustrates a smart device or a computer system or a System-on-Chip (SoC) with an imprint-free write driver, according to some embodiments.

FIG. 12 illustrates a smart device or a computer system or a System-on-Chip (SoC) with an imprint-free write driver, according to some embodiments. FIG. 12 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with an imprint-free write driver, according to some embodiments discussed. Other blocks of the computing device 1600 may also include an imprint-free write driver, according to some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. In some embodiments, audio subsystem 1620 includes apparatus and/or machine executable instructions to avoid self-hearing, according to some embodiments. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: a source line; a bit-line; a memory bit-cell coupled to the source line and the bit-line; a first multiplexer coupled to the bit-line; a second multiplexer coupled to the source-line; a first driver coupled to the first multiplexer; a second driver coupled to the second multiplexer; and a current source coupled to the first and second drivers.

Example 2

The apparatus of example 1, wherein the first driver comprises a first transistor controllable by a SET signal, and a second transistor coupled in series with the first transistor, wherein the second transistor is to provide current.

Example 3

The apparatus of example 2, wherein the second driver comprises a first transistor controllable by a RESET signal, and a second transistor coupled in series with the first transistor, wherein the second transistor is to provide current.

Example 4

The apparatus of example 3, wherein the second transistor of the first driver and the second transistor of the second driver are coupled to the current source.

Example 5

The apparatus of example 1, wherein the memory bit-cell comprises a transistor coupled to a ferroelectric capacitor including ferroelectric material.

Example 6

The apparatus of example 5, wherein the ferroelectric material includes: a first layer comprising metal; a second layer comprising metal; and two or more layers coupled between the first and second layers, wherein the two or more layers include a first layer comprising a conductive oxide, a second layer comprising a conductive oxide, and a third layer comprising a perovskite, wherein the third layer is adjacent to the first and second layers.

Example 7

The apparatus of example 6, wherein the two or more layers comprises a fourth layer adjacent to one of the first or second layers, wherein the fourth layer comprises a conductive seed layer.

Example 8

The apparatus of example 7, wherein the fourth layer includes one of: Ti, Al, Nb, La, or Si.

Example 9

The apparatus of example 7, wherein the first and second layers of the two or more layers include one of: Sr, Ru, La, Sr, Mn, Nb, Cr, or O.

Example 10

The apparatus of example 7, wherein the third layer includes one of: Sr, Ti, O, Bi, Fe, or Ba.

Example 11

The apparatus of example 7, wherein the third layer includes a super lattice of $PbTiO_3$ (PTO) and $SrTiO_3$ (STO).

Example 12

The apparatus of example 11, wherein the super lattice of PTO and STO are repeated in a range of 2 to 100 times.

Example 13

The apparatus of example 5, wherein the transistor is coupled to a word-line.

Example 14

An apparatus comprising: a source line; a bit-line; a memory bit-cell coupled to the source line and the bit-line; a first multiplexer coupled to the bit-line; a second multiplexer coupled to the source-line; a first driver coupled to the first multiplexer; a second driver coupled to the second multiplexer; a first current source coupled to the first driver; and a second current source coupled to the second driver.

Example 15

The apparatus of example 15 according to any of examples 2 to 13.

Example 16

A system comprising: a processor; a memory coupled to the processor, the memory according to any one of apparatus examples 1 to 13, or apparatus claims 14 to 15; and a wireless interface to allow the processor to communicate with another device.

Example 17

An apparatus comprising: a source line; a bit-line; a memory bit-cell coupled to the source line and the bit-line; a first multiplexer coupled to the bit-line; a second multiplexer coupled to the source-line; a first driver coupled to the first multiplexer, wherein the first driver is biased by a first adjustable bias; and a second driver coupled to the second multiplexer, wherein the second driver is biased by a second adjustable bias.

Example 18

The apparatus of example 17, wherein the first driver comprises a first transistor controllable by a SET signal, and a second transistor coupled in series with the first transistor, wherein the second transistor is to provide current and is biased by the first adjustable bias.

Example 19

The apparatus of example 17, wherein the second driver comprises a first transistor controllable by a RESET signal, and a second transistor coupled in series with the first transistor, wherein the second transistor is to provide current and is biased by the second adjustable bias.

Example 20

The apparatus of example 17, wherein the memory bit-cell comprises a transistor coupled to a ferroelectric capacitor including ferroelectric material, wherein the transistor is coupled to a word-line.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

Figure 13:
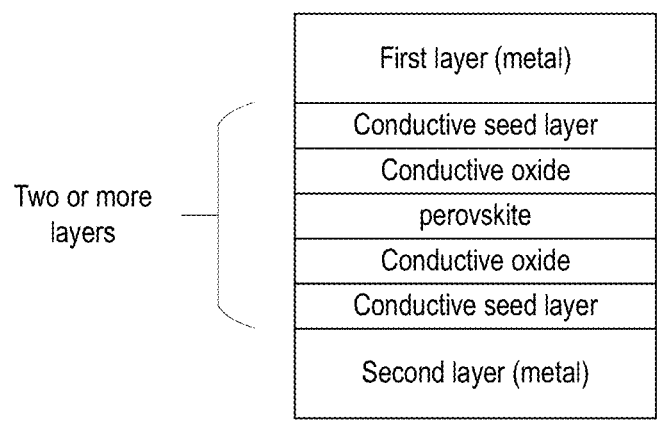
FIG. 13 illustrates a cross-section of a ferroelectric capacitor, in accordance with some embodiments.

FIG. 13 illustrates a cross-section of a ferroelectric capacitor, in accordance with some embodiments. In some embodiments, the ferroelectric capacitor includes: a first layer comprising metal; a second layer comprising metal; and two or more layers coupled between the first and second layers. In some embodiments, the two or more layers include a first layer comprising a conductive oxide, a second layer comprising a conductive oxide, and a third layer comprising a perovskite, wherein the third layer is adjacent to the first and second layers. In some embodiments, the two or more layers comprises a fourth layer adjacent to one of the first or second layers, wherein the fourth layer comprises a conductive seed layer.

We claim:

1. An apparatus comprising:
a source-line;
a bit-line;
a memory bit-cell coupled to the source-line and the bit-line;
a first multiplexer coupled to the bit-line;
a second multiplexer coupled to the source-line;
a first driver coupled to the first multiplexer;
a second driver coupled to the second multiplexer; and
a current source coupled to the first driver and the second drivers via a current mirror.

2. The apparatus of claim 1, wherein the first driver comprises:
a first transistor, coupled to a resistor, wherein the first transistor is controllable by a signal to set a value in the memory bit-cell; and
a second transistor coupled in series with the first transistor, wherein the second transistor is to provide current.

3. The apparatus of claim 2, wherein the resistor is a first resistor, wherein the second driver comprises:
a first transistor, coupled to a second resistor, wherein the first transistor of the second driver is controllable by a signal to reset the value in the memory bit-cell; and
a second transistor coupled in series with the first transistor, wherein the second transistor is to provide current.

4. The apparatus of claim 3, wherein the second transistor of the first driver and the second transistor of the second driver are coupled to the current source.

5. The apparatus of claim 1, wherein the memory bit-cell comprises a transistor coupled to a ferroelectric capacitor including ferroelectric material.

6. The apparatus of claim 5, wherein the ferroelectric capacitor includes:
a first layer comprising metal;
a second layer comprising metal; and
two or more layers coupled between the first layer and the second layer, wherein the two or more layers include a first layer comprising a conductive oxide, a second layer comprising a conductive oxide, and a third layer comprising a perovskite, and wherein the third layer is adjacent to the first layer and the second layer.

7. The apparatus of claim 6, wherein the two or more layers comprises a fourth layer adjacent to one of the first layer or the second layer, and wherein the fourth layer comprises a conductive seed layer.

8. The apparatus of claim 7, wherein the fourth layer includes one of: Ti, Al, Nb, La, or Si.

9. The apparatus of claim 7, wherein the first layer and the second layer of the two or more layers include one of: Sr, Ru, La, Sr, Mn, Nb, Cr, or O.

10. The apparatus of claim 7, wherein the third layer includes one of: Sr, Ti, O, Bi, Fe, or Ba.

11. The apparatus of claim 7, wherein the third layer includes a super lattice of $PbTiO_3$ (PTO) and $SrTiO_3$ (STO).

12. The apparatus of claim 11, wherein the super lattice of PTO and STO are repeated in a range of 2 to 100 times.

13. The apparatus of claim 5, wherein the transistor is coupled to a word-line.

14. An apparatus comprising:
a source-line;
a bit-line;

a memory bit-cell coupled to the source-line and the bit-line;
a first multiplexer coupled to the bit-line;
a second multiplexer coupled to the source-line;
a first driver coupled to the first multiplexer;
a second driver coupled to the second multiplexer;
a first current source coupled to the first driver via a first current mirror; and
a second current source coupled to the second driver via a second current mirror.

15. The apparatus of claim 14, wherein the first driver comprises:
a first transistor, coupled to a resistor, wherein the first transistor is controllable by a signal to set a value in the memory bit-cell; and
a second transistor coupled in series with the first transistor, wherein the second transistor is to provide current.

16. The apparatus of claim 15, wherein the resistor is a first resistor, wherein the second driver comprises:
a first transistor, coupled to a second resistor, wherein the first transistor of the second driver is controllable by a signal to reset the value in the memory bit-cell; and
a second transistor coupled in series with the first transistor, wherein the second transistor is to provide current.

17. The apparatus of claim 16, wherein the second transistor of the first driver and the second transistor of the second driver are coupled to their respective current sources.

18. A system comprising:
a processor;
a memory coupled to the processor, the memory comprising:
a source-line;
a bit-line;
a memory bit-cell coupled to the source-line and the bit-line;
a first multiplexer coupled to the bit-line;
a second multiplexer coupled to the source-line;
a first driver coupled to the first multiplexer;
a second driver coupled to the second multiplexer; and
a current source coupled to the first driver and the second driver via a current mirror; and
a wireless interface to allow the processor to communicate with another device.

19. The system of claim 18, wherein the first driver comprises:
a first transistor, coupled to a resistor, wherein the first transistor is controllable by a signal to set a value in the memory bit-cell; and
a second transistor coupled in series with the first transistor, wherein the second transistor is to provide current.

20. The system of claim 19, wherein the resistor is a first resistor, wherein the second driver comprises:
a first transistor, coupled to a second resistor, wherein the first transistor of the second driver is controllable by a signal to reset the value in the memory bit-cell; and
a second transistor coupled in series with the first transistor, wherein the second transistor is to provide current.

* * * * *